United States Patent
Faschinger

(10) Patent No.: US 7,259,404 B2
(45) Date of Patent: Aug. 21, 2007

(54) LIGHT-EMITTING SEMICONDUCTOR COMPONENT HAVING LAYERS PREDOMINANTLY CONTAINING ELEMENTS OF PERIODIC TABLE GROUP II AND VI

(75) Inventor: Wolfgang Faschinger, deceased, late of Hochberg (DE); by Osram Opto Semiconductors GmbH, legal representative, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/299,747

(22) Filed: Nov. 19, 2002

(65) Prior Publication Data

US 2004/0012010 A1    Jan. 22, 2004

Related U.S. Application Data

(63) Continuation of application No. PCT/DE01/01927, filed on May 21, 2001.

(30) Foreign Application Priority Data

May 19, 2000    (DE) ............................... 100 24 924

(51) Int. Cl.
*H01L 29/24*    (2006.01)
*H01L 33/00*    (2006.01)

(52) U.S. Cl. ................... 257/103; 257/101; 257/102; 257/79

(58) Field of Classification Search ............... 257/13, 257/79–103, 918

See application file for complete search history.

(56) References Cited

U.S. PATENT DOCUMENTS

| 5,377,214 A | * | 12/1994 | Ahn ............................ 372/45 |
| 5,422,902 A | | 6/1995 | Mensz |
| 6,031,244 A | | 2/2000 | Noguchi et al. |
| 6,078,062 A | * | 6/2000 | Kuramoto et al. ............ 257/96 |

FOREIGN PATENT DOCUMENTS

| JP | 408032180 | * | 2/1996 |
| JP | 408264900 | * | 10/1996 |
| JP | 10 107376 A | | 4/1998 |
| WO | WO94/15369 | | 7/1994 |

OTHER PUBLICATIONS

Korn et al., Growth of ZnSe . . . beam epitaxy, 1999, pp. 448-452.*

(Continued)

*Primary Examiner*—Monica Lewis
(74) *Attorney, Agent, or Firm*—Laurence A. Greenberg; Werner H. Stemer; Ralph E. Locher

(57) ABSTRACT

A light-emitting semiconductor component has a number of layers that predominantly contain elements of groups II and VI of the Periodic Table. The layers are applied epitaxially on a substrate, preferably made of InP, and include a p-doped covering layer and an n-doped covering layer having lattice constants of which correspond to that of the substrate. An undoped active layer lies between the two covering layers. The active layer forms a quantum well structure in interaction with its neighboring layers, a lattice constant of the active layer being made smaller than that of the neighboring layers.

16 Claims, 2 Drawing Sheets

OTHER PUBLICATIONS

Zeng et al., Quality improvement . . . interfacial layer, 1998, pp. 1317-1319.*

Iwata et al., MgZnSeTe/ZnCdSe/MgZnCdSe Double . . . Diodes, 437-440.*

Faschinger et al., MBE Growth of ZnMgSeTe Light Emitting Diodes, 1994, Proceedings of the SPIE-vol. 2346, pp. 50-60.*

Naniwae, K. et al.: "MBE Growth of ZnCdSe and MgZnCdSe Alloys on InP Substrates with a GaInAs Buffer-Layer", Elsevier Science B. V., Journal of Crystal Growth, vol. 159, 1996, pp. 36-40.

Zeng, L. et al.: "Quality Improvement of $Zn_x Cd_y Mg_{1-x-y}$ Se Layers Grown on InP Substrates by a Thin ZnCdSe Interfacial Layer", American Institute of Physics, Applied Physics Letters, vol. 72, No. 11, Mar. 16, 1998, pp. 1317-1319.

Ferreira, S.O. et al.: "Room Temperature Blue Electroluminescence from the ZnMgCdSe Quaternary System", Elsevier Science B. V., Journal of Crystal Growth, vol. 159, 1996, pp. 640-643.

Nomura, I. et al.: "Novel ZnCdSe/MgZnCdSe Compound System Grown on InP Substrates by MBE and Theoretical Investigation of 550-640 nm Range ZnCdSe/MgZnSe Lasers", Elsevier Science B. V., Journal of Crystal Growth, vol. 159, 1996, pp. 11-15.

Zeng, L. et al.: "Red-Green-Blue Phototpumped Lasing from ZnCdMgSe/ZnCdSe Quantum Well Laser Structure Grown on InP", American Institute of Physics, Applied Physics Letters, vol. 72, No. 24, Jun. 15, 1998, pp. 3136-3138.

Cavus, A. et al.: "ZnCdSe/ZnCdMgSe Quantum Wells on InP Substrates for Visible Emitters", American Institute of Physics, Applied Physics Letters, vol. 68, No. 24, Jun. 10, 1996, pp. 3446-3448.

Huang, W. et al.: "Optical Gain due to Excitonic Transitions in ZnCdSe/ZnMgSSe Strained Layer Quantum Well Blue-Green Layers: Prediction of Low Threshold Under Tensile Strain", American Institute of Physics, Applied Physics Letters, vol. 66, No. 13, Mar. 27, 1995, pp. 1596-1598.

Faschinger, W. et al.: "Green II-VI Light Emitting Diodes with Long Lifetime on InP Substrate", American Institute of Physics, Applied Physics Letters, vol. 77, No. 2, Jul. 10, 2000, pp. 187-189.

Fischer, F.: "Electrical Properties of Light-Emitting Devices Based on the II-VI Compounds BeTe and BeMgZnSe", Elsevier Science S. A., Materials Science and Engineering, B43, 1997, pp. 92-96.

Iwata, H. et al.: "MgZnSeTe/ZnCdSe/MgZnCdSe Double Heterostructure Light-Emitting Diodes", 2nd Intern.Symp.on Blue Laser and Light Emitting Diodes, Chiba, Japan, Sep. 29-Oct. 2, 1998, pp. 437-440.

Korn, M. et al.: "Growth of ZnSe-(Zn,Mg)(S,Se) Superlattices by Molecular Beam Epitaxy", Elsevier Science B. V., Journal of Crystal Growth, 201/202, 1999, pp. 448-452.

Suda, J. et al.: "Optical Properties of Light-Hole Excitions in ZnSSe/ZnMgSSe Tensile-Strained Quantum Wells", Elsevier Science B. V., Journal of Crystal Growth, 184/185, 1998, pp. 863-866.

* cited by examiner

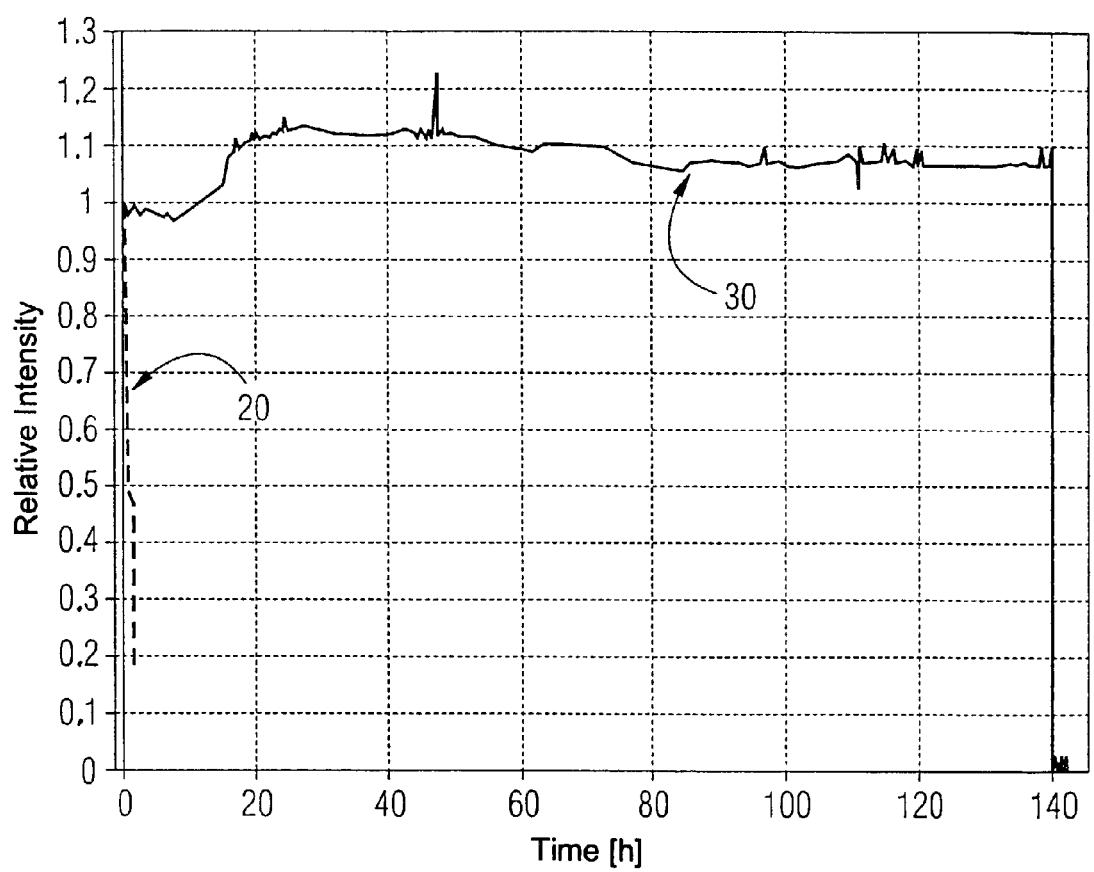

LIGHT-EMITTING SEMICONDUCTOR COMPONENT HAVING LAYERS PREDOMINANTLY CONTAINING ELEMENTS OF PERIODIC TABLE GROUP II AND VI

CROSS-REFERENCE TO RELATED APPLICATION

This application is a continuation of copending International Application No. PCT/DE 01/01927, filed May 21, 2001, which designated the United States and was not published in English.

BACKGROUND OF THE INVENTION

Field of the Invention

The invention relates to a light-emitting semiconductor component having a number of layers which predominantly contain elements of groups II and VI of the Periodic Table. The layers are applied epitaxially on a substrate, preferably made of InP, and have a p-doped covering layer and an n-doped covering layer, the lattice constants of which correspond to that of the substrate. An undoped active layer lies between the two layers and forms a quantum well structure in interaction with its neighboring layers.

Semiconductor components with a quantum well structure are used in broad areas of technology. They are employed as a light-emitting diode, for example for signaling different operating states, or as a laser diode, e.g. in the optical recording or reproduction of image and sound on carrier material, laser printers, medical laser apparatuses or materials processing. Laser diodes of this type are distinguished by a low threshold current, high output power and low beam divergence. These properties have led to light-emitting semiconductor components with a quantum well structure occupying a preferred position in application and development.

Present-day technically usable semiconductor components with a quantum well use elements from groups III and V of the Periodic Table. They are based on the materials gallium arsenide (GaAs), gallium aluminum arsenide (GaAlAs) and gallium nitride (GaN). The light generated by these components lies in the infrared, yellow and violet spectral regions.

Through the development of methods for the p-doping of zinc selenite (ZnSe) with the aid of nitrogen plasma, semiconductor components whose layers are predominantly constructed from elements of groups II and VI of the Periodic Table have gained great interest in research and development since they would cover the hitherto lacking spectral region from green to blue. This spectral region is also of interest because light at these wavelengths affords the advantage of a high resolution which—on account of the resolution limit governed by diffraction—is all the greater, the shorter the wavelength.

The reference by I. Nomura et al., titled "Journal of Crystal Growth 159" (1996) 11-15, describes a theoretical model of a ZnCdSe/MgZnCdSe laser, which poses considerable problems in practice on account of inadequate p-dopability of MgZnCdSe.

The reference by W. Hang and F. C. Jain, Appl. Phys. Lett. 66 (13), Mar. 27, 1995, 1596-1598, discloses a calculation of the system ZnSeTe-ZnCdSe. ZnSeTe, together with ZnCdSe, forms a so-called type II system, which results in that the electrons and holes are concentrated in different layers and therefore recombine spatially indirectly, that is to say inefficiently and in a strongly red-shifted fashion. This structure is fundamentally unsuitable for a laser, for example.

A proposal according to Applied Physics Letters, Vol. 68, June 1996 uses InP as a substrate and the following layer construction:

| | | |
|---|---|---|
| n-doped covering layer | n-ZnMgCdSe | doped with Cl |
| Waveguide layer | ZnMgCdSe | |
| Active layer | ZnCdSe | undoped |
| Waveguide layer | ZnMgCdSe | |
| p-doped covering layer | p-ZnMgCdSe | doped with N, |

The lattice constant of the active layer corresponds identically to that of the neighboring layers and that of the substrate. A problem that has been found in the case of this construction is that the doping with nitrogen, given this composition of the p-doped layer, leads only to low acceptor concentrations, so that it has not been possible to demonstrate electroluminescence heretofore.

SUMMARY OF THE INVENTION

It is accordingly an object of the invention to provide a light-emitting semiconductor component that overcomes the above-mentioned disadvantages of the prior art devices of this general type, which provides light in the green to blue spectral region and at the same time has a high lifetime.

With the foregoing and other objects in view there is provided, in accordance with the invention, a light-emitting semiconductor component. The light-emitting semiconductor component containing a substrate and a number of layers predominantly containing elements of periodic table groups II and VI. The layers are applied epitaxially on the substrate. The layers include a p-doped covering layer, an n-doped covering layer, and at least one active layer lying between the p-doped covering layer and the n-doped covering layer and forming a quantum well structure in interaction with neighboring layers. The p-doped covering layer and the n-doped covering layer have different chemical compositions, and the active layer has a lattice constant smaller than that of the neighboring layers.

The object is achieved by virtue of the fact that the lattice constant of the active layer is made smaller than that of the neighboring layers.

On account of the different lattice constants between the active layer and the neighboring layers thereof a tensile stress is produced within the active layer. The tensile stress leads to a considerable increase in the lifetime of the semiconductor component. Under technical operating conditions, lifetimes are achieved which are at least three orders of magnitude higher than the prior art with a comparable density of macroscopic defects.

The performance enhancement obtained in the case of semiconductor components according to the present invention is based on the insight that the drastic fall in performance in the case of known semiconductor components containing elements of groups II and VI of the Periodic Table have fundamental causes of a thermodynamic nature. It is to the credit of the present invention to have identified the relationships. The causes will be briefly expounded with reference to the above-mentioned layer construction of known semiconductor components.

The p-doping of ZnSe by nitrogen leads to an unstable nitrogen acceptor. It decomposes into a stable complex $(N_1-V_{se})^{3+}$, containing an interstitial nitrogen atom $N_1$ and a selenium vacancy $V_{se}$. This complex is positively charged and diffuses into the quantum well region of the active zone in particular during operation of the semiconductor component. The complexes are captured there, accumulated and, at relatively high concentration, ultimately lead to dark line defects.

The capture process is controlled by the mechanical stress between the active layer and the neighboring layers. Since the ZnCdSe of the active layer has a larger lattice constant than the ZnSe of the neighboring layer, the active layer has a compressive strain relative to its two neighboring layers. However, the compressive strain in the active zone of known laser diodes constructed from elements from groups II and VI of the Periodic Table promotes the capture of vacancies, since this process leads to a reduction of the lattice constant and thus to a decrease in the stress-governed energy. According to the laws of thermodynamics, this state, whose energy is lower than the state before the capture process, is the more stable state of the two.

The capture process can therefore be prevented if active layer and neighboring layers are formed in such a way that a tensile stress prevails between them. In this case the stress repels vacancies, thereby avoiding the formation of the dark line defects.

A preferred embodiment of the semiconductor component according to the invention has the following layer construction:

| Layer | Composition | Doping | Lattice constant |
|---|---|---|---|
| p-doped covering layer | p-ZnMgTeSe | doped with N | =InP |
| Active layer | ZnCdSe | undoped | <InP |
| n-doped covering layer | n-ZnMgCdSe | doped with Cl | =InP |
| Substrate | InP | | =InP |

The individual layers of the semiconductor component are applied on a substrate made of InP and have a p-doped covering layer, an n-doped covering layer and an undoped active layer lying in between. Molecular beam epitaxy (MBE) is employed as a method for applying the layers. It should be clarified that the doping of the p-type layer can, but need not necessarily, be carried out with nitrogen plasma and that of the n-type layer with zinc chloride.

The elements—predominantly elements of groups II and VI of the Periodic Table—from which the individual layers are constructed can also be gathered from the overview. This selection of the elements ensures that a tensile stress prevails between the active layer and the neighboring layers, since the lattice constant of ZnCdSe is smaller than that of ZnMgTeSe or ZnMgCdSe.

In a departure from the prior art, the p-doped and n-doped covering layers have different chemical compositions. In addition to the elements ZnMgSe that are jointly represented in both layers, the n-doped layer has Cd, whereas the p-doped layer has Te instead.

The Te in the p-doped layer is accorded the role not only of setting the lattice constants of the active layer and the neighboring layers to a defined difference and thus keeping vacancies away from the active layer, but also of actively preventing the formation of vacancies.

Specifically, calculations and experiments have shown that in the case of semiconductor components whose p-doped and n-doped layers contain ZnSe, through the introduction of Te, for example, into the p-doped layer during the p-doping by nitrogen, the $(N_1-V_{SE})^{3+}$ complex is not stable and therefore does not form. On account of this instability, the complex therefore has no opportunity to diffuse into the active layer and produce the dark line defects.

Through the introduction of Te into the p-doped layer, therefore, the formation of the above-mentioned stable complexes is proportionately reduced and the formation of the dark line defects during operation of the semiconductor component is thereby reduced further. The optimum effect is achieved by the highest possible concentration of Te in the p-doped layer, i.e. when an element of the n-doped layer is completely replaced by Te in the p-doped layer.

Variants of this embodiment are configured such that their p-doped layer contains the element Be and/or Cd. The introduction of these elements into the p-doped layer achieves effects similar to those achieved by the introduction of Te.

With knowledge of these facts, further preferred embodiments of the semiconductor component according to the invention are configured such that the p-doped layer is formed by superlattices, preferably of the combinations ZnMgSe/ZnTe, ZnMgSe/ZnMgTe, and/or MgSe/ZnTe.

The semiconductor component according to the invention can be configured as a spontaneously emitting light-emitting diode or an induced emitting laser diode. The above-described construction containing p-doped layer, active layer and n-doped layer is characteristic of a light-emitting diode. Configuring the semiconductor component as a laser diode necessitates additional layers, which can be gathered from the overview below.

| Layer | Composition | Doping | Layer Thickness in nm | Lattice constant |
|---|---|---|---|---|
| p-doped covering layer | p-ZnMgTeSe | Doped with N | 1000 | =InP |
| Waveguide layer | ZnMgCdSe | | 200 | =InP |
| Active layer | ZnCdSe | Undoped | 2 | <InP |
| Waveguide layer | ZnMgCdSe | | 200 | =InP |
| n-doped covering layer | n-ZnMgCdSe | Doped with Cl | 1000 | =InP |
| Buffer layer | n-ZnCdSe | | 20 | |
| Buffer layer | n-GaInAs | | 50 | =InP |
| Substrate | InP | | | =InP |
| | | | | =Inp |

The layer construction has, in addition to the p-doped covering layer, the n-doped covering layer and the undoped active layer lying in between, two waveguide layers which enclose the active layer, the energy gap thereof being smaller than that of the covering layer, and the two buffer layers between the substrate and the p-doped layer. The waveguide layers have the task of effecting total reflection perpendicularly to the layer plane for the light generated in the active layer and thus of preventing the emergence of the light in these directions. The buffer layers, on the other hand, have the task of cushioning electrical or crystallographic problems during the transition between the different materials.

Moreover, laser operation requires the end faces of the active layer and its neighboring layers to have a high optical quality. The diode body thereby forms an optical resonator in which laser light is generated upon application of a current whose intensity exceeds the threshold current intensity.

Construction and quantitative composition of the active layer substantially influence the properties of the emitted light. The semiconductor component according to the invention can be configured in such a way that different configurations in each case generate light with mutually different properties.

The frequency or wavelength of the emitted light is of particular interest. It is determined by the energy gap between valence and conduction bands (or between the sublevels thereof) of the quantum well structure in the active layer.

In the case of semiconductor components with a quantum well structure, the frequency can be prescribed within certain limits by the mixing ratio of the individual elements of the active layer with respect to one another. The mixing ratio defines the lattice constant and thereby determines the frequency of the emitted light.

In a preferred embodiment of the semiconductor component, the quantitative composition of the individual layers containing the elements mentioned is given by the following formulae. Layers with the elements are state below:

| | | |
|---|---|---|
| ZnMgCdSe satisfy the formula: | $Zn_{(1-x-y)} Mg_x Cd_y Se$ | where $0.4 \leq x \leq 0.6$ and $0.15 \leq x \leq 0.3$, |
| ZnMgSeTe satisfy the formula: | $Zn_{(1-x-y)} Mg_x Se_{(1-y)} Te_y$ | where $0.4 \leq x \leq 0.6$ and $0.15 \leq y \leq 0.3$, |
| ZnCdSe satisfy the formula: | $Zn_{(1-x)} Cd_x Se$ | where $0 \leq x \leq 0.5$. |

According to the predetermined formula, the Zn and Cd proportions of the active layer can be varied within wide limits and light of different wavelengths can thus be generated.

One variant of the present embodiment is configured such that the active layer has a high proportion of Cd and correspondingly a low proportion of Zn. The light emitted by this variant lies in the green spectral region. In a further variant, by contrast, a low proportion of Cd and a high proportion of Zn are prescribed in the active layer. This variant emits light in the blue spectral region.

What is to be regarded as an essential advantage of the semiconductor component according to the invention is that, by prescribing corresponding mixing ratios during production, the wavelength of the emitted light can be set to arbitrary values between blue and green.

The intensity of the radiation generated by the semiconductor component is determined by the current intensity of the applied current. The intensity of the radiation increases as the current intensity rises.

However, the intensity of the radiation emitted by the semiconductor component can also be varied by constructive specifications. These constructive specifications relate to the number of quantum wells present in the active layer. Correspondingly, in one variant of the semiconductor component according to the invention, a structure with multiple quantum wells is formed in the active layer. The structure increases the intensity of the emitted light given the same current intensity of the externally applied current.

In the case of the semiconductor component considered, further buffer layers are also provided in addition to the layers forming the actual semiconductor component. The layers have the task of cushioning electrical or crystallographic problems during the transition between the different materials.

One development of this type has two further layers, formed by n-GaInAs and n-ZnCdSe, between the substrate and the n-doped covering layer.

Problems during the transition between the different materials can also be cushioned by virtue of the fact that, within a layer, the proportion of one or more elements changes continuously over the layer thickness.

A construction of this type is employed in the current feeding of an advantageous variant of the semiconductor component according to the present invention. In layered semiconductor components, the electric current is generally fed transversely with respect to the layers. Gold is predominantly used as the contact material. If a gold layer is applied directly on a ZnSe-containing p-doped layer, the result is a contact having a relatively high resistance. Contacts having a lower resistance and, moreover, a virtually linear, i.e. ohmic, current/voltage profile are obtained on layers containing ZnTe.

Therefore, in the case of the variant discussed, a further layer is applied on the p-doped layer at the side remote from the active layer, within which further layer the proportion of Se decreases continuously, whereas that of Te increases continuously. The contact for the current feeding is provided on the layer surface having the high Te proportion.

Other features which are considered as characteristic for the invention are set forth in the appended claims.

Although the invention is illustrated and described herein as embodied in a light-emitting semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a graph showing lifetime measurements.

DESCRIPTION OF THE PREFERRED EMBODIMENTS

Figure 1A:
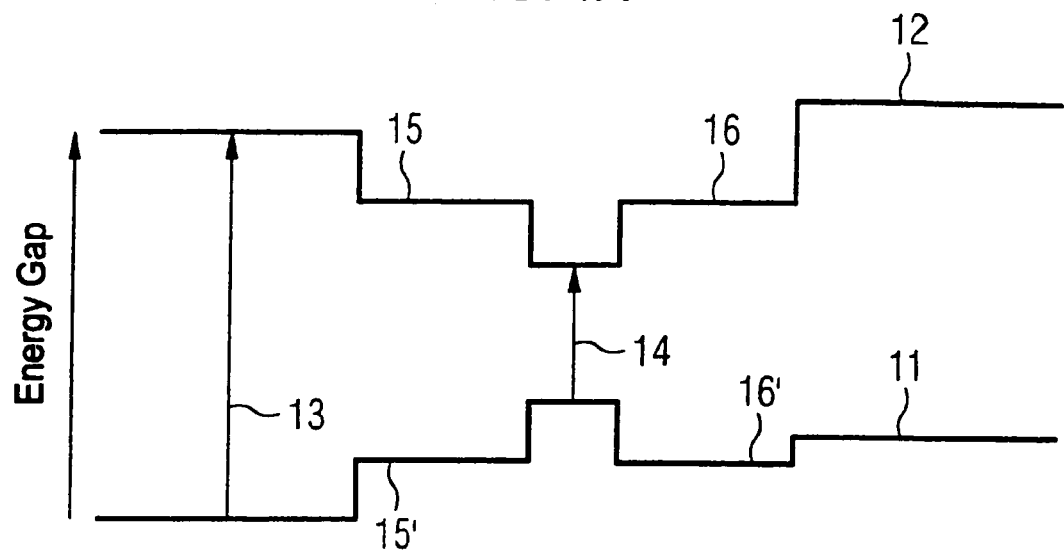
FIG. 1A is an illustration of an energy level profile of a semiconductor component according to the invention.
Figure 1B:
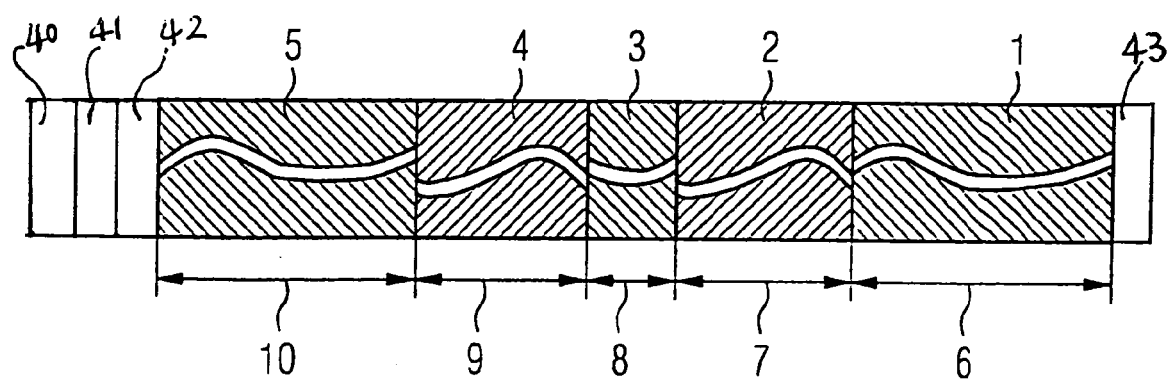
FIG. 1B is a diagrammatic, sectional view of individual layers of the semiconductor component.

Referring now to the figures of the drawing in detail and first, particularly, to FIG. 1A thereof, there is shown a profile of an energy gap in individual layers of a semiconductor component. The individual layers of the semiconductor component are indicated in FIG. 1B. The layers include a p-doped covering layer 1 made of p-ZnMgTeSe having a thickness 6, a waveguide layer 2 made of ZnMgCdSe having a thickness 7, an active layer 3 made of ZnCdSe having a thickness 8, a waveguide layer 4 made of ZnMgCdSe having a thickness 9, and an n-doped covering layer 5 made of n-ZnMgCdSe having a thickness 10.

FIG. 1A shows a valence band edge 11 and a conduction band edge 12 within the individual layers. The energy gap between the two edges is represented by the distance 13 between the two curves. Reference numeral 14 identifies the energy gap within the active layer. The size of the gap is a measure of the frequency of the light radiation generated in the active layer 3.

An essential feature of the present invention is the asymmetrical shaping of the profile of the two band edges over the individual layers. The asymmetry becomes clear from the unequal step heights 15 and 16 or 15' and 16'. The asymmetry is caused by the asymmetrical, i.e. containing different elements, extension of the p-doped and n-doped layers.

As can be seen in FIG. 1B, the layers 1-5 of the semiconductor component are formed on a substrate 40, which is made of InP. Further layers 41 and 42, made of n-doped ZnCdSe and n-doped GaInAs, respectively, may be disposed between the n-doped covering layer 5 and the substrate 40. A further layer 43 maybe applied on the p-doped covering layer 1. The further layer 43 has a proportion of Se decreasing continuously or stepwise over a layer thickness and a proportion of Te increasing continuously or stepwise over the layer thickness.

The semiconductor components according to the present invention exhibit a long lifetime. Measurement curves in this respect are represented in FIG. 2. A first curve 20 shows, as a function of time, the profile of the intensity of the emitted radiation in the case of a semiconductor component according to the prior art that is constructed on GaAs and whose p-doped layer contains the elements ZnMgSSe. A second curve 30 represents the corresponding profile for a semiconductor component according to the invention, constructed on InP with a p-doped layer made of ZnMgTeSe. Boundary conditions for the measurement are: room temperature, continuous wave operation (i.e. continuously emitting semiconductor element), current density 50 A/cm$^2$. It can easily be seen from the two measurement curves that the lifetime of the semiconductor component according to the invention differs by orders of magnitude from that of the semiconductor component according to the prior art.

I claim:

1. A light-emitting semiconductor component, comprising:
    a substrate; and
    a number of layers predominantly containing elements of periodic table groups II and VI, said layers applied epitaxially on said substrate, said layers including a p-doped covering layer, an n-doped covering layer, and at least one active layer lying between said p-doped covering layer and said n-doped covering layer and forming a quantum well structure, said p-doped covering layer and said n-doped covering layer having different chemical compositions other than dopant, and said active layer having a lattice constant smaller than the lattice constant of said p-doped covering layer and the lattice constant of said n-doped covering layer.

2. The light-emitting semiconductor component according to claim 1, wherein:
    said p-doped covering layer is formed from the elements Zn, Mg, Se, and Te;
    said n-doped covering layer is formed from the elements Zn, Mg, Cd, and Se; and
    said active layer is formed from the elements Zn, Cd, and Se.

3. The light-emitting semiconductor component according to claim 2, wherein said p-doped covering layer contains admixtures of at least one of Be and Cd.

4. The light-emitting semiconductor component according to claim 1, wherein said p-doped covering layer has super-lattices.

5. The light-emitting semiconductor component according to claim 2, further comprising:
    a first further layer composed of Zn, Mg, Cd, and Se with a smaller energy gap than said n-doped covering layer and disposed between said n-doped covering layer and said active layer; and
    a second further layer composed of Zn, Mg, Cd, and Se with a smaller energy gap than said p-doped covering layer and disposed between said p-doped covering layer and said active layer.

6. The light-emitting semiconductor component according to claim 5, wherein the light-emitting semiconductor component is a semiconductor laser.

7. The light-emitting semiconductor component according to claim 5, wherein:
    a quantitative composition of said n-doped covering layer, said first further layer and said second further layer all contain the elements Zn, Mg, Cd, and Se and satisfies a formula $Zn_{(1-x-y)}Mg_xCd_ySe$ where $0.4 \leq x < 0.6$ and $0.15 \leq y \leq 0.3$;
    said p-doped covering layer contains the elements Zn, Mg, Se, and Te and satisfies a formula $Zn_{(1-x-y)}Mg_xSe_{(1-y)}Te_y$, where $0.4 \leq x \leq 0.6$ and $0.15 \leq y \leq 0.3$; and
    said active layer contains the elements Zn, Cd, and Se and satisfies a formula $Zn_{(1-x)}Cd_xSe$, where $0 \leq x \leq 0.5$.

8. The light-emitting semiconductor component according to claim 1, wherein said active layer has a structure with multiple quantum wells formed therein.

9. The light-emitting semiconductor component according to claim 2, wherein within said active layer, said n-doped covering layer, and said p-doped covering layer, a proportion of at least one of the elements changes over a layer thickness.

10. The light-emitting semiconductor component according to claim 1, wherein said active layer is undoped.

11. The light-emitting semiconductor component according to claim 1, wherein said substrate is made of InP.

12. The light-emitting semiconductor component according to claim 1, wherein said p-doped covering layer is formed by superlattices having at least one combination selected from the group consisting of ZnMgSe/ZnTe, ZnMgSe/ZnMgTe and MgSe/ZnTe.

13. The light-emitting semiconductor component according to claim 7, wherein said active layer has a lower proportion of Cd than of Zn.

14. The light-emitting semiconductor component according to claim 7, wherein said active layer has a higher proportion of Cd than of Zn.

15. The light-emitting semiconductor component according to claim 1, further comprising two further layers made of n-doped ZnCdSe and n-doped GaInAs, respectively, and disposed between said n-doped covering layer and said substrate.

16. The light-emitting semiconductor component according to claim 9, further comprising a further layer applied on said p-doped covering layer, said further layer having a proportion of Se decreasing one of continuously and stepwise over a layer thickness and a proportion of Te increasing one of continuously and stepwise over said layer thickness.

* * * * *